(12) United States Patent
Simmons-Matthews

(10) Patent No.: US 8,759,154 B2
(45) Date of Patent: Jun. 24, 2014

(54) TCE COMPENSATION FOR PACKAGE SUBSTRATES FOR REDUCED DIE WARPAGE ASSEMBLY

(71) Applicant: Texas Instruments Incorporated, Dallas, TX (US)

(72) Inventor: Margaret Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/625,932

(22) Filed: Sep. 25, 2012

(65) Prior Publication Data

US 2013/0029457 A1    Jan. 31, 2013

Related U.S. Application Data

(62) Division of application No. 12/770,058, filed on Apr. 29, 2010, now Pat. No. 8,298,863.

(51) Int. Cl.
*H01L 21/44* (2006.01)
*H01L 21/48* (2006.01)

(52) U.S. Cl.
USPC ..... 438/113; 438/108; 438/126; 257/E21.599

(58) Field of Classification Search
USPC ........... 438/113, 108, 126, 110; 257/E21.599
See application file for complete search history.

(56) References Cited

U.S. PATENT DOCUMENTS

| 6,284,573 | B1 * | 9/2001 | Farnworth | 438/114 |
|---|---|---|---|---|
| 6,294,407 | B1 * | 9/2001 | Jacobs | 438/118 |
| 7,569,427 | B2 * | 8/2009 | Theuss | 438/127 |
| 7,811,903 | B2 * | 10/2010 | Grigg et al. | 438/459 |
| 7,981,727 | B2 * | 7/2011 | Liu et al. | 438/113 |
| 8,012,857 | B2 * | 9/2011 | Grivna et al. | 438/462 |
| 2003/0199121 | A1 * | 10/2003 | Caletka et al. | 438/113 |
| 2007/0155048 | A1 * | 7/2007 | Lee et al. | 438/106 |
| 2011/0233706 | A1 * | 9/2011 | Hong et al. | 257/433 |

* cited by examiner

*Primary Examiner* — Nitin Parekh
(74) *Attorney, Agent, or Firm* — Steven A. Shaw; Wade James Brady, III; Frederick J. Telecky, Jr.

(57) ABSTRACT

A method for assembling die packages includes attaching contacts on a first side of a plurality of first die to substrate pads on a top surface of a composite carrier. The composite carrier includes a package substrate including at least one embedded metal layer having its bottom surface secured to a semiconductor wafer. The composite carrier minimizes effects of the CTE mismatch between the die and the package substrate during assembly reduces warpage of the die. After the attaching, the semiconductor wafer is removed from the package substrate. Electrically conductive connectors are attached to the bottom surface of the package substrate, and the package substrate is sawed to form a plurality of singulated die packages.

9 Claims, 4 Drawing Sheets

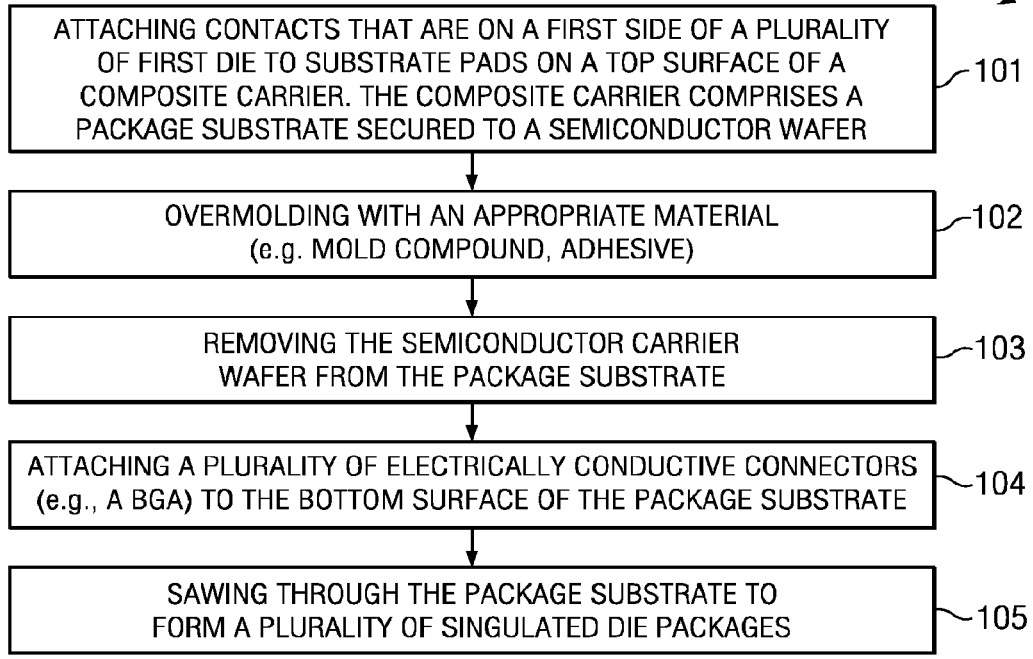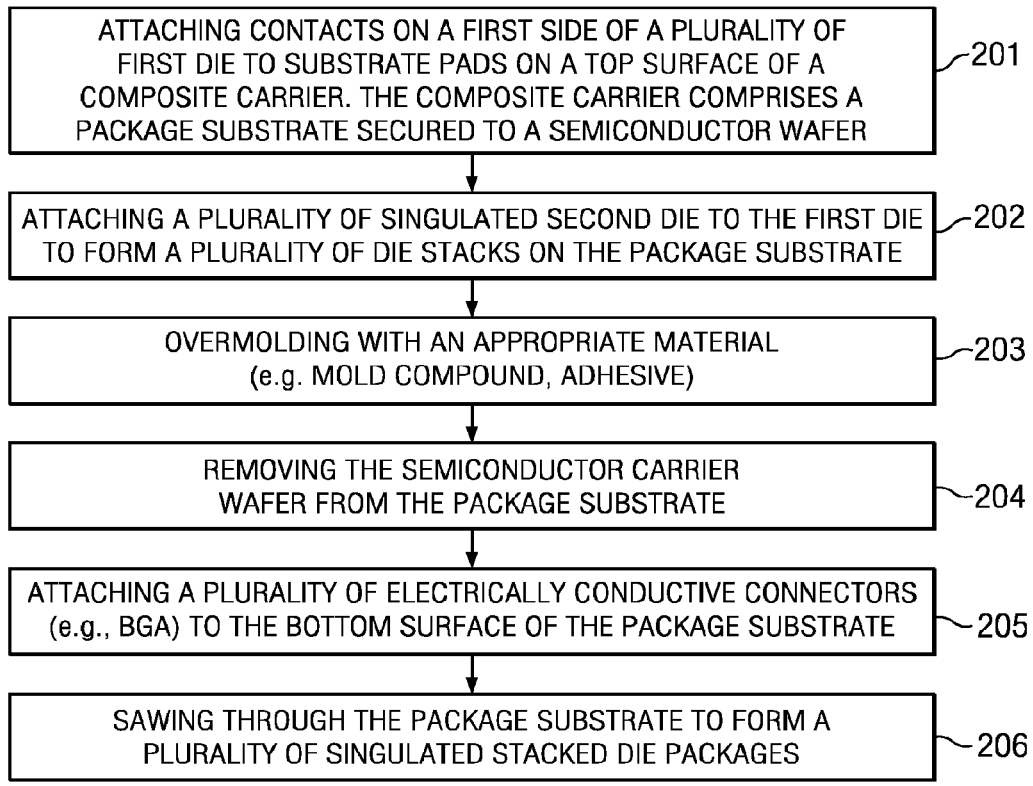

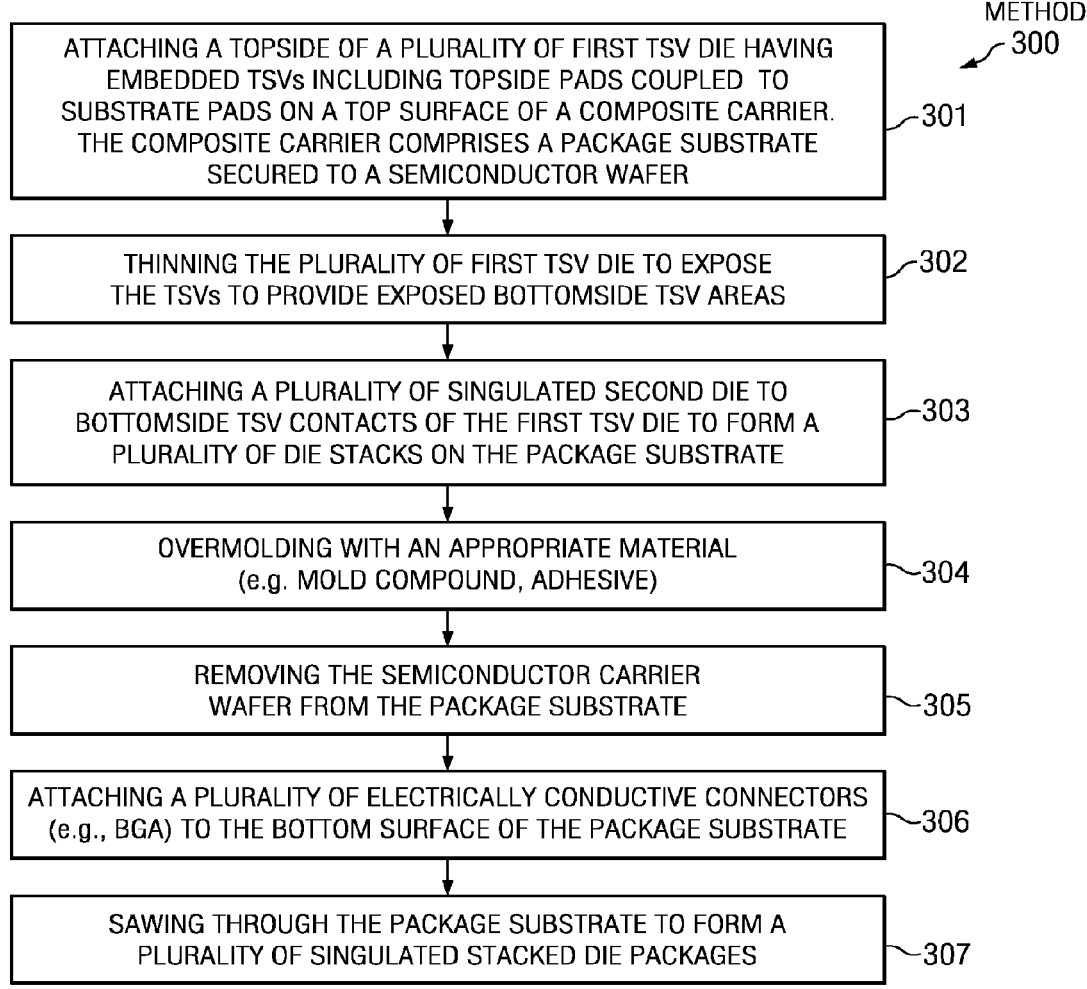

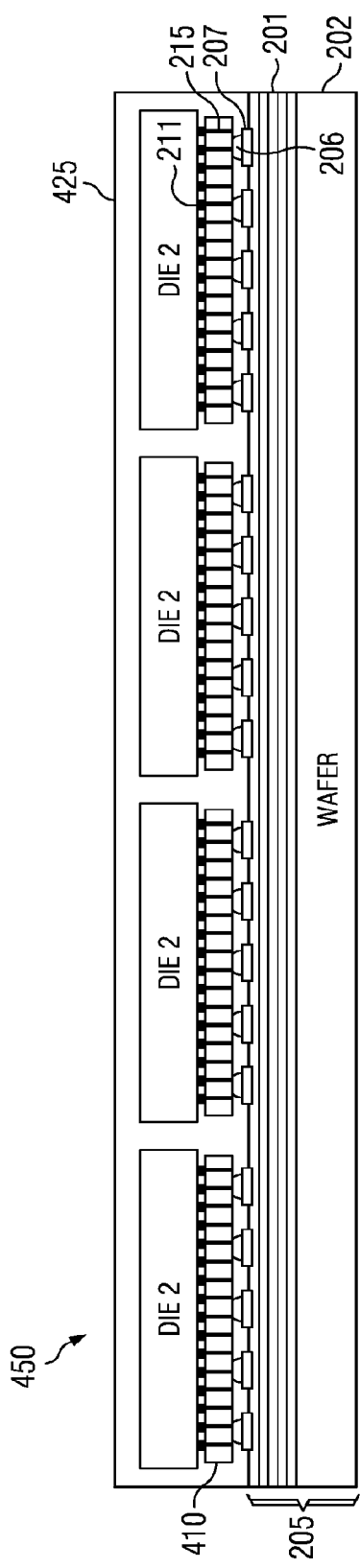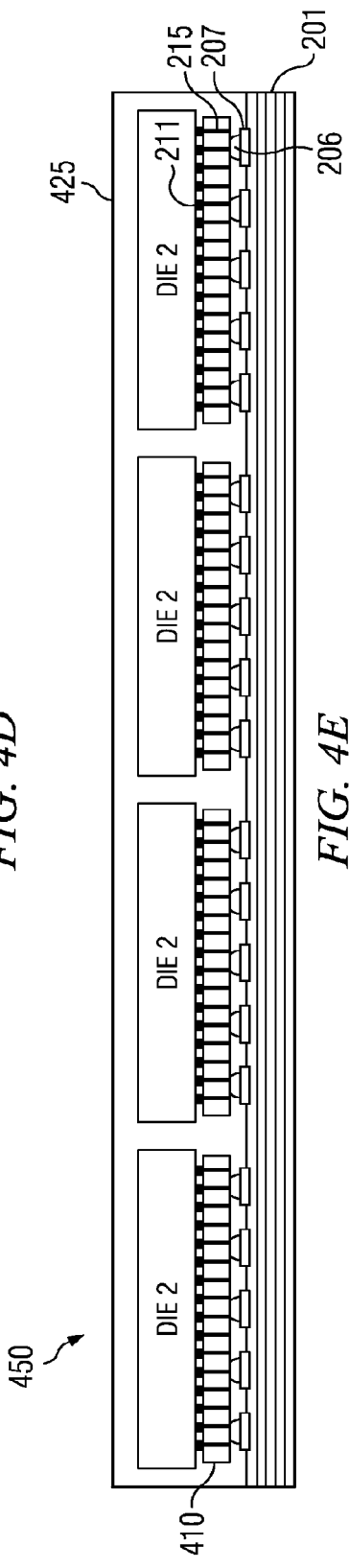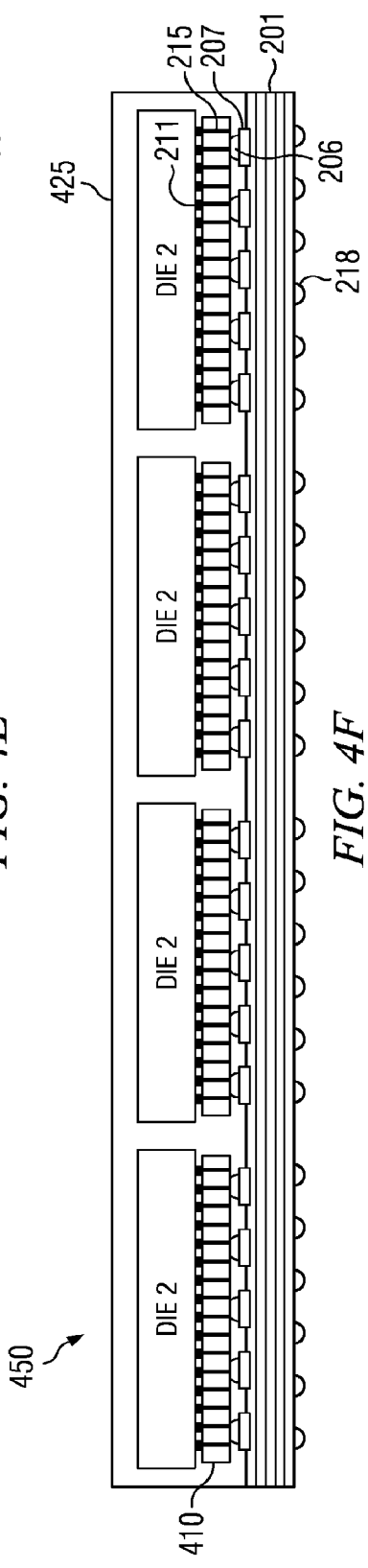

TCE COMPENSATION FOR PACKAGE SUBSTRATES FOR REDUCED DIE WARPAGE ASSEMBLY

CROSS REFERENCE TO RELATED APPLICATION

This application is a continuation of and claims priority to U.S. patent application Ser. No. 12/770,058, filed on Apr. 29, 2010, said application herein incorporated by reference.

FIELD

Disclosed embodiments relate to integrated circuit (IC) packaging, and more particularly to die assembly.

BACKGROUND

As known in the art, "die bonding" or "die attach" describes the operation of attaching semiconductor die either to a package substrate or to some other substrate such as tape carrier for tape automated bonding. The die is first picked from a separated wafer or waffle tray, aligned to a target pad on the carrier or substrate, and then permanently attached, usually by a solder or epoxy bond.

Die attach temperatures during assembly of IC die is generally performed at a temperature of least 150° C., and can be performed at temperatures of 375° C. or more for eutectic die attach. Assembly of very thin die (<100 µm thick, e.g., 20 to 80 µm) to some package substrates, such as organic substrates, is known to be difficult due to the warpage of the die caused by the large coefficient of thermal expansion (CTE) mismatch between the die and the package substrate. For example, in the case of a silicon die, the CTE of the die may be about 3 ppm/° C., and the CTE of the organic substrate may be about 20 ppm/° C. or higher. This problem can be further aggravated by thin package substrates (e.g., about 100-200 µm thick) that may lack of rigidity over temperature.

Even minimal die warpage can cause alignment and resulting die attach problems in the case of small area and/or dense die contacts. Misaligned joints reduces contact area that increases contact resistance of the joints, and can even cause open circuited contacts. For example, contacts associated with through substrate vias (TSVs; referred to herein as through silicon vias in the particular case of a silicon substrate) can be very small in area. Similarly, if other contact structures such as pillars (e.g., copper pillars) or studs (e.g., gold studs) become small enough and/or dense enough, warpage can become a significant problem. Warpage is also especially problematic for die stacks when one of the die has contacts on both sides, for example, involving flip chip package substrate connections on one side of the die and small area TSV connections on the other side of the die.

One known method for addressing the above described warpage problem is using low CTE package substrates that provide improved CTE matching relative to the die. For example, ceramic substrates and some specialized polymer substrates may provide improved CTE matching with the die. However, low CTE package substrates are generally significantly more expensive as compared to conventional epoxy-glass resin-based (e.g., BT resin) organic substrates. What is needed is new packaging methodology for minimizing warpage and resulting effects of the CTE mismatch between the die and package substrate during assembly to allow use of conventional polymer substrates.

SUMMARY

Disclosed embodiments describe new packaging methodology for minimizing effects of CTE mismatch between the die and the package substrate during assembly that notably allows use of low cost conventional polymer substrates while providing reduced warpage of the die. A composite carrier comprising a package substrate including at least one embedded metal layer that has its bottom surface secured to a semiconductor wafer controls the CTE mismatch between the die and the substrate. The Inventor has recognized that the CTE of the composite carrier will be largely driven by the CTE of the semiconductor carrier wafer which is selected to match the CTE of the die so that despite the CTE mismatch between the die and the package substrate, the package substrate will have little impact on ΔCTE driven warpage during assembly. In one embodiment, the die and the wafer carrier can both comprise silicon.

The package substrate is generally a polymer substrate, such as an organic substrate. In a typical embodiment, the package substrate has a TCE that is at least is 10 ppm/° C. different (typically being higher) as compared to the CTE of the die.

The composite carrier can be provided prior to the start of the assembly process. Die attach processing is performed on the package substrate while the semiconductor wafer is attached thereto that acts as a carrier wafer. The semiconductor wafer may be removed later in the assembly flow after all die attachment is complete at which time the need for flat die surfaces is no longer generally important. Following removal of the carrier wafer, a plurality of electrically conductive connectors (e.g., a BGA) can then be attached to the bottom surface of the package substrate. Sawing through the package substrate forms a plurality of die packages.

Disclosed embodiments include assembly of single die packages and stacked die packages that include two or more stacked die. The die can include TSV die.

BRIEF DESCRIPTION OF THE DRAWINGS

FIG. 1 shows an exemplary method for assembling die packages, according to a disclosed embodiment.

FIG. 2 shows an exemplary method for assembling stacked die packages, according to a disclosed embodiment.

FIG. 3 shows an exemplary method for assembling stacked die packages that include TSV die, according to a disclosed embodiment.

FIGS. 4A-G show successive cross sectional depictions that result from steps in the exemplary method described relative to FIG. 3.

DETAILED DESCRIPTION

Figure 4A:
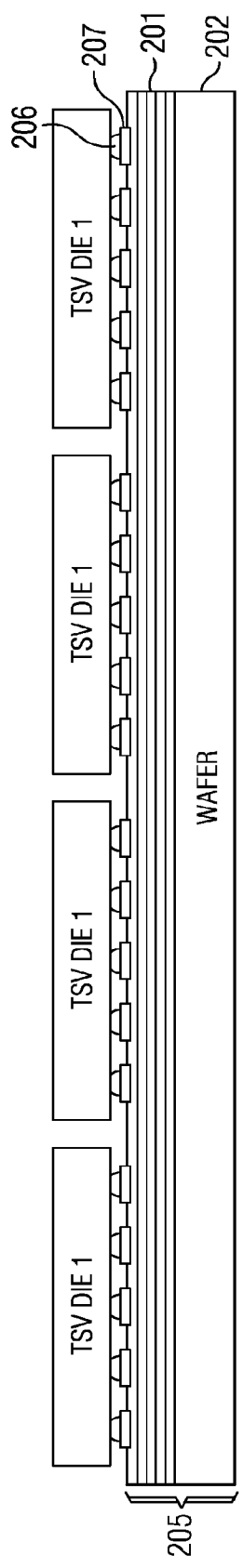

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 shows an exemplary method 100 for assembling die packages, according to a disclosed embodiment. Step 101 comprises attaching contacts that are on a first side of a plurality of first die to substrate pads on a top surface of a composite carrier. The first die may be attached face down (i.e., flip chip) or face (i.e., circuit side) up (e.g., for later wire bonding, or using TSV die). The CTE difference between the die (e.g., about 3 ppm/° C. for a silicon die) and the package substrate is generally at least 10 ppm/° C. In a typical embodiment step 101 comprises die attach and underfill of a plurality of singulated die to a polymer package substrate via reflow soldering of solder bumps, copper pillars, gold studs, or other suitable attachment method. The plurality of first die can be provided in wafer form, instead of singulated die form, so that the wafer is attached to the package substrate.

The composite carrier comprises a package substrate including at least one (and generally a plurality of) embedded metal layer(s) having its bottom surface secured to a semiconductor wafer. The package substrate can be a polymer substrate, such as an organic substrate. The package substrate can also be a ceramic substrate or other substrate. The package substrate can be a thin package substrate, such as an organic substrate that has a thickness of <200 µm, such as about 100 to 200 µm. As noted above, the CTE of the composite carrier will be largely driven by the CTE of the semiconductor carrier wafer which is selected to match the CTE of the die. Accordingly, despite the CTE mismatch between the die and the package substrate, the package substrate will have little impact on ΔCTE driven warpage during assembly.

Step 102 comprises an optional overmolding step that can comprise overmolding with an appropriate material (e.g., mold compound, adhesive). Step 103 comprises removing the semiconductor carrier wafer from the package substrate. Release methods can include thermal, solvent or laser aided methods. Step 104 comprises attaching a plurality of electrically conductive connectors (e.g., a BGA) to the bottom surface of the package substrate. Step 105 comprises sawing through the package substrate to form a plurality of singulated die packages.

FIG. 2 shows an exemplary method 200 for assembling stacked die packages, according to a disclosed embodiment. Step 201 comprises attaching contacts on a first side of a plurality of first die to substrate pads on a top surface of a composite carrier. The composite carrier comprises a package substrate including at least one embedded metal layer having its bottom surface secured to a semiconductor wafer. In a typical embodiment, step 201 comprises die attach and underfill of a plurality of singulated first die to a polymer package substrate via reflow soldering of solder bumps, copper pillars, gold studs, or other suitable attachment method. As described above, the plurality of first die can be provided in wafer form so that the wafer is attached to the package substrate.

In step 202 a plurality of singulated second die are attached to the first die to form a plurality of die stacks on the package substrate. In a typical embodiment singulated second die are attached using soldering or copper bonding, and are then underfilled.

Step 203 comprises an optional overmolding step that can comprise overmolding with an appropriate material (e.g., mold compound, adhesive). Step 204 comprises removing the semiconductor carrier wafer from the package substrate. As described above, release methods can include thermal, solvent or laser aided methods. Step 205 comprises attaching a plurality of electrically conductive connectors (e.g., BGA) to the bottom surface of the package substrate. Step 206 comprises sawing through the package substrate to form a plurality of singulated stacked die packages.

FIG. 3 shows an exemplary method 300 for assembling stacked die packages that include TSV die, according to a disclosed embodiment. Step 301 comprises attaching a topside of a plurality of first TSV die having embedded TSVs including topside pads coupled to substrate pads on a top surface of a composite carrier. In a typical embodiment step 301 comprises die attach and underfill singulated first TSV die to a polymer package substrate via reflow soldering of solder bumps, copper pillars, or other suitable attachment method. The plurality of first TSV die can be provided in wafer form referred to herein as a TSV wafer.

In step 302 the plurality of first TSV die are thinned to expose the TSVs to provide exposed bottomside TSV areas. Methods for thinning can include backgrind, chemical mechanical polishing (CMP), and/or chemical etch. Bottomside TSV contacts to the exposed TSV areas can then be formed. Step 303 comprises attaching a plurality of singulated second die to the bottomside TSV contacts of the first TSV die to form a plurality of die stacks on the package substrate. In a typical embodiment singulated second die are attached using soldering or copper bonding, and are then underfilled.

Step 304 comprises an optional overmolding step that can comprise overmolding with an appropriate material (e.g., mold compound, adhesive). Step 305 comprises removing the semiconductor carrier wafer from the package substrate. As described above, release methods can include thermal, solvent or laser aided methods. Step 306 comprises attaching a plurality of electrically conductive connectors (e.g., BGA) to the bottom surface of the package substrate. Step 307 comprises sawing through the package substrate to form a plurality of singulated stacked die packages.

FIGS. 4A-G show successive cross sectional depictions that result from steps in the exemplary method described relative to FIG. 3. FIG. 4A is a cross sectional depiction following die attach and underfill of singulated TSV die (shown as TSV Die 1) to a multi-layer substrate 201 that is adhered to a semiconductor wafer 202 (e.g., a silicon wafer) that together constitute composite carrier 205. TSV die 1 are shown flip chip attached. Topside pads 206 of TSV die 1 are shown coupled to substrate pads 207 on the package substrate 201. TSV Die 1 are generally at least 500 µm thick.

Figure 4B:
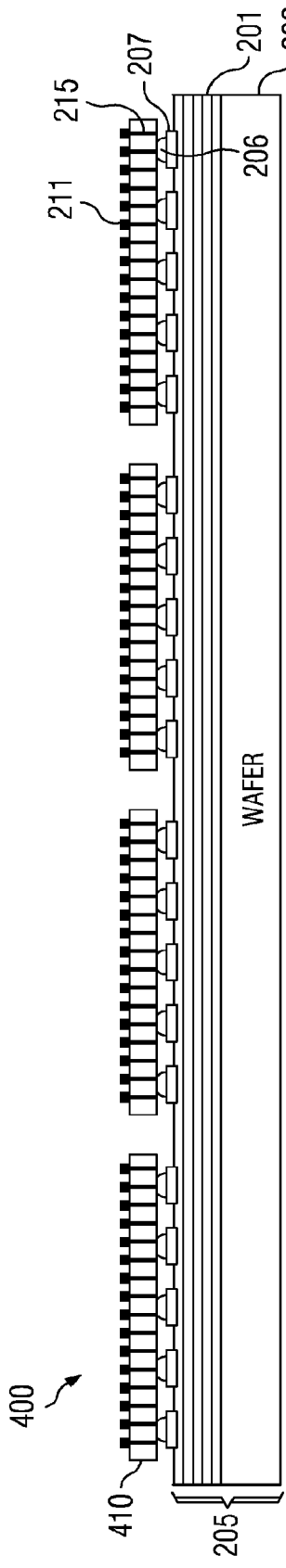
Figure 4C:
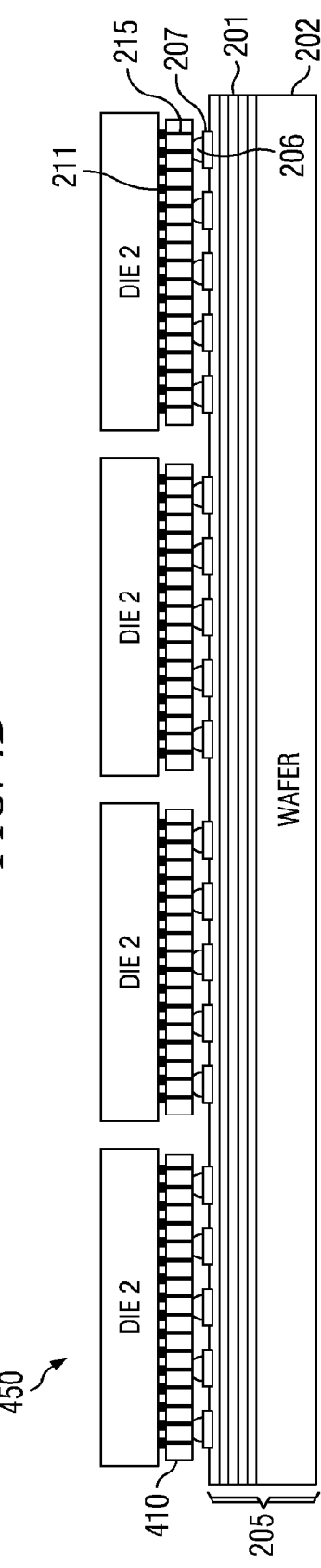

FIG. 4B is a cross sectional depiction showing an electronic assembly 400 following thinning of the bottomside of the TSV Die 1 to form a thinned TSV die 410 by an appropriate method, such as backgrind, CMP, and/or substrate (e.g., a silicon) etch to expose embedded TSVs 215. The thinned TSV die 1 are generally <150 µm thick, typically 20 to 80 µm thick. TSV contact pads 211 (e.g. copper pads) are shown on the exposed portion of TSVs 215. At least a portion of the TSVs 215 are coupled to the topside pads 206. FIG. 4C is a cross sectional depiction showing an electronic assembly 450 following die attach and underfill of singulated 2$^{nd}$ die (shown as Die 2) to thinned TSV die 410 via a suitable method such as soldering, or copper bonding. FIG. 4D is a cross sectional depiction following overmolding with an appropriate material 425 such as mold compound or an adhesive. FIG. 4E is a cross sectional depiction following removal of the semiconductor wafer 202 from bottom of the polymer package substrate 201. In one embodiment Die 2 is a memory die and TSV Die 1 is a processor die. Although not shown, additional die may be stacked on Die 2.

FIG. 4F is a cross sectional depiction following attaching of BGA package solder balls 218 to the package substrate 201. FIG. 4G is a cross sectional depiction following sawing through the overmold 425 and package substrate 201 to singulate the stacked die packages.

Although the composite carrier has been described above as comprising a package substrate on a semiconductor wafer, the package substrate can comprise entirely the semiconductor (e.g., silicon, to match the semiconductor die) to achieve the same controlled warpage during the assembly process.

The active circuitry formed on the top semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

I claim:

1. A method for assembling stacked die packages, comprising:
    attaching contacts on a first side of a plurality of first die to substrate pads on a top surface of a composite carrier, wherein said composite carrier comprises a package substrate including at least one embedded metal layer having its bottom surface secured to a semiconductor wafer;
    attaching each of a plurality of singulated second die to respective one from said plurality of first die to form a plurality of die stacks on said package substrate;
    removing said semiconductor wafer from said package substrate;
    attaching a plurality of electrically conductive connectors to said bottom surface of said package substrate, and
    sawing said package substrate to form a plurality of singulated stacked die packages.

2. The method of claim 1, wherein said semiconductor wafer comprises a silicon wafer and said package substrate comprises an organic substrate.

3. The method of claim 1, wherein said plurality of first die comprises through substrate via (TSV) die that include TSVs, wherein said contacts include contacts to said TSVs.

4. The method of claim 3, further comprising:
    thinning a second side of said plurality of TSV die to expose said TSVs to provide exposed TSV areas, and
    attaching a plurality of singulated second die to respective said TSV contacts coupled to said exposed TSV areas to form a plurality of die stacks on said package substrate.

5. The method of claim 1, wherein said plurality of first die are disposed on a wafer.

6. The method of claim 1, wherein said plurality of first die comprise singulated die.

7. A method for assembling stacked die packages, comprising:
    attaching a topside of a plurality of singulated through substrate via (TSV) die having embedded TSVs including topside pads coupled to respective said TSVs to substrate pads on a top surface of a composite carrier, said composite carrier comprising an organic substrate including at least one embedded metal layer having its bottom surface secured to a silicon wafer;
    thinning a bottomside of said plurality of singulated TSV die to provide exposed TSV areas;
    forming bottomside TSV contacts on said exposed TSV areas;
    attaching a plurality of singulated second die to respective said bottomside TSV contacts to form a plurality of die stacks on said organic substrate;
    removing said silicon wafer from said organic substrate;
    attaching a plurality of electrically conductive connectors to said bottom surface of said organic substrate, and
    sawing through said organic substrate to form a plurality of singulated stacked die packages.

8. The method of claim 7, wherein said plurality of TSV die are disposed on a TSV wafer.

9. The method of claim 7, wherein said plurality of TSV die comprise singulated TSV die.

* * * * *